US010054371B2

(12) United States Patent
Espersen et al.

(10) Patent No.: US 10,054,371 B2
(45) Date of Patent: Aug. 21, 2018

(54) THERMOSIPHON WITH INTEGRATED COMPONENTS

(71) Applicant: Aavid Thermalloy, LLC, Laconia, NH (US)

(72) Inventors: Morten Søegaard Espersen, Bologna (IT); Marco Moruzzi, Bologna (IT); Dennis N. Jensen, Bologna (IT); Sukhvinder S. Kang, Concord, NH (US)

(73) Assignee: Aavid Thermalloy, LLC, Laconia, NH (US)

( * ) Notice: Subject to any disclaimer, the term of this patent is extended or adjusted under 35 U.S.C. 154(b) by 0 days.

(21) Appl. No.: 15/444,743

(22) Filed: Feb. 28, 2017

(65) Prior Publication Data

US 2017/0167798 A1 Jun. 15, 2017

Related U.S. Application Data

(63) Continuation of application No. PCT/US2014/053131, filed on Aug. 28, 2014.

(51) Int. Cl.
*F28D 15/02* (2006.01)
*H01L 23/427* (2006.01)
*H01L 23/367* (2006.01)

(52) U.S. Cl.
CPC ....... *F28D 15/025* (2013.01); *F28D 15/0266* (2013.01); *H01L 23/427* (2013.01); *H01L 23/3672* (2013.01); *H01L 2924/0002* (2013.01)

(58) Field of Classification Search
CPC . F28D 15/025; F28D 15/0266; H01L 23/427; H01L 23/3672; H01L 2924/0002

(Continued)

(56) References Cited

U.S. PATENT DOCUMENTS 4,694,323 A * 9/1987 Itahana ............... H01L 23/427
165/80.4
4,949,164 A * 8/1990 Ohashi ................ H01L 23/427
165/104.33

(Continued)

FOREIGN PATENT DOCUMENTS

CN 2096721 U 2/1992
CN 1551724 A 12/2004

(Continued)

OTHER PUBLICATIONS

PCT/US23014/053131, Mar. 9, 2017, International Preliminary Report on Patentability.

(Continued)

*Primary Examiner* — Justin Jonaitis
(74) *Attorney, Agent, or Firm* — Wolf, Greenfield & Sacks, P.C.

(57) ABSTRACT

A thermosiphon device includes an evaporator section that is formed as a single integrated part including one or more evaporation channels and a liquid return path, and/or includes a condenser section that is formed as a single integrated part including one or more condensing channels and a vapor supply path. A single manifold may include vapor and liquid chambers that are separate from each other and that fluidly connect evaporation channels with the vapor supply path and fluidly connect condensing channels with the liquid return path, respectively. Portions of the evaporator or condenser section that define the liquid return path or vapor supply path, respectively, may be free of any fins or other thermal transfer structure.

34 Claims, 16 Drawing Sheets

(58) Field of Classification Search
USPC .................................................. 165/104.21
See application file for complete search history.

(56) References Cited

U.S. PATENT DOCUMENTS

| | | | | |
|---|---|---|---|---|
| 5,613,552 A | * | 3/1997 | Osakabe | F28D 15/0233 |
| | | | | 165/104.21 |
| 5,655,598 A | * | 8/1997 | Garriss | F28D 15/0266 |
| | | | | 165/104.14 |
| 5,713,413 A | * | 2/1998 | Osakabe | F28D 15/0233 |
| | | | | 165/104.33 |
| 6,357,517 B1 | * | 3/2002 | Osakabe | H01L 23/427 |
| | | | | 165/104.21 |
| 9,113,578 B2 | * | 8/2015 | Cottet | H05K 7/20672 |
| 2008/0236790 A1 | * | 10/2008 | Bhatti | F28D 15/0233 |
| | | | | 165/80.3 |
| 2012/0111553 A1 | * | 5/2012 | Tsoi | F28D 15/0233 |
| | | | | 165/185 |
| 2017/0307301 A1 | * | 10/2017 | Sorensen | F28D 15/0266 |

FOREIGN PATENT DOCUMENTS

| | | |
|---|---|---|
| CN | 102440086 A | 5/2012 |
| EP | 2 031 332 A1 | 3/2009 |
| EP | 2 246 653 A1 | 11/2010 |
| EP | 2 327 947 A1 | 6/2011 |
| JP | H09-167818 A | 6/1997 |

OTHER PUBLICATIONS

International Search Report and Written Opinion for Application No. PCT/US2014/053131, dated Apr. 24, 2015.
International Preliminary Report on Patentability for International Application No. PCT/US2014/053131, dated Mar. 9, 2017.

* cited by examiner

THERMOSIPHON WITH INTEGRATED COMPONENTS

CROSS REFERENCE TO RELATED APPLICATION

This application claims priority under 35 U.S.C. § 120 to and is a continuation of International Application No. PCT/US2014/053131, filed Aug. 28, 2014, which is incorporated herein by reference in its entirety.

BACKGROUND OF THE INVENTION

1) Field of Invention

This invention relates generally to thermosiphon devices and other heat transfer devices that employ a two-phase fluid for cooling.

2) Description of Related Art

Thermosiphon devices are widely used for cooling systems, such as integrated circuits and other computer circuitry. For example, U.S. Patent Publication 2013/0104592 discloses a thermosiphon cooler used to cool electronic components located in a cabinet or other enclosure.

SUMMARY OF THE INVENTION

In one aspect of the invention, a liquid return path of a thermosiphon device may be integrated as a single, integrated part with one or more evaporation channels of the device. In addition, or alternately, a vapor supply path of the thermosiphon device maybe integrated as a single, integrated part with one or more condensing channels of the device. This is in contrast to devices in which the liquid return path (which conducts condensed cooling liquid from a condenser section to an evaporator section) and a vapor supply path (which conducts evaporated liquid from the evaporator section to the condenser section) are arranged as separate parts in relation to the evaporation and condensing channels. For example, such devices are arranged with dedicated liquid return and vapor supply conduits to route liquid/vapor to desired sections of the thermosiphon device. This approach is taken, at least in some cases, in an effort to ensure that cyclical flow in the device is not disrupted, e.g., by liquid in the liquid return conduit prematurely evaporating or vapor in the vapor supply conduit prematurely condensing. As is understood by those of skill in the art, such premature evaporation/condensation can disrupt the cyclical flow in a thermosiphon device, which occurs by gravity alone, and without the use of pumps or other fluid movers. However, aspects of the invention enable the successful integration of a liquid return path with one or more evaporation channels and/or integration of a vapor supply path with one or more condensing channels without disruption of flow in a thermosiphon device.

For example, in some embodiments, a conductive thermal transfer structure, such as a plurality of fins, may be in direct, conductive thermal contact with portions of an evaporator section adjacent one or more evaporation channels, yet be out of direct conductive contact with portions adjacent a liquid return path. As a result, the fins or other structure will not transfer heat to the liquid return path, allowing the liquid in the liquid return path to remain a liquid until provided into the evaporation channel(s). Similarly, a conductive thermal transfer structure, such as a plurality of fins, may be in direct, conductive thermal contact with portions of a condenser section adjacent one or more condensing channels, yet be out of direct conductive contact with portions adjacent a vapor supply path. As a result, the fins or other structure will not receive heat from the vapor supply path, allowing the vapor in the vapor supply path to remain a vapor until provided into the condensing channel(s).

In another aspect of the invention, a single manifold having separate vapor and liquid chambers may be used to fluidly connect evaporation channels of an evaporator section with the vapor supply path of a condenser section, and fluidly connect condensing channels of the condenser section with the liquid return path of the evaporator section. In some embodiments, a separation wall in an internal space of the manifold may separate the internal space into the liquid and vapor chambers. In addition, the separation wall may engage evaporator and condenser sections of the device so as to effectively put condensing channels and the vapor supply path on opposite sides of the wall, and put evaporation channels and the liquid return path on opposite sides of the wall, i.e., put condensing channels and the liquid return path in communication with the liquid chamber and put the vapor supply path and evaporation channels in communication with the vapor chamber. This is in contrast with other thermosiphon arrangements that use separate conduit and/or manifold arrangements to couple the condensing channels and liquid return path and couple the evaporation channels and vapor supply path. The use of a single manifold can simplify the device, as well as simplify its assembly.

In one aspect, a thermosiphon cooling device includes an evaporator section including at least one evaporation channel arranged to receive heat and evaporate a liquid in the at least one evaporation channel and a liquid return path for delivering condensed liquid to the at least one evaporation channel. A condenser section includes at least one condensing channel arranged to transfer heat from evaporated liquid to a surrounding environment to condense the evaporated liquid and a vapor supply path for delivering evaporated liquid to the at least one condensing channel. A manifold may fluidly connect the at least one evaporation channel with the vapor supply path, and fluidly connect the at least one condensing channel with the liquid return path. In some embodiments, the at least one evaporation channel and the liquid return path may be integrated into a single unitary part and/or the at least one condensing channel and the vapor supply path may be integrated into a single unitary part.

In some embodiments, the manifold includes an outer wall that defines an interior cavity and a separation wall positioned in the interior cavity to separate the interior cavity into a vapor chamber and a liquid chamber. The outer wall may have a plurality of openings each to receive a manifold end of a corresponding evaporator section or condenser section, e.g., one or more evaporator sections may be received at a corresponding one of the plurality of openings and engage the separation wall such that the at least one evaporation channel is in fluid communication with the vapor chamber and the liquid return path is in fluid communication with the liquid chamber. Also, one or more condenser sections may be received at a corresponding one of the plurality of openings and engage the separation wall such that the at least one condensing channel is in fluid communication with the liquid chamber and the vapor supply path is in fluid communication with the vapor chamber.

In some embodiments, the plurality of evaporation channels and the liquid return path of each evaporator section are arranged in parallel with the liquid return path at one edge of the evaporator section, and the plurality of condensing channels and the vapor supply path of each condenser section are arranged in parallel with the vapor supply path at one edge of the condenser section. For example, the evaporator and condenser sections may be formed as a flat tube with a plurality of channels that define multiple evaporator channels and the liquid return path, or multiple condenser channels and the vapor supply path. Each evaporator section and each condenser section may have a respective manifold end engaged with the manifold and that is opposite a turnaround of the section. The separation wall of the manifold may engage the evaporator section and the condenser section so that the evaporation channels and the liquid return path are on opposite sides of the separation wall, and the condensing channels and the vapor supply path are on opposite sides of the separation wall. A cap may close the turnaround of each section and fluidly couple the respective evaporation channels or condensing channels with the corresponding liquid return path or vapor supply path. The caps may also include a conduit for fluid communication with an adjacent cap, e.g., so the evaporator sections or condenser sections are fluidly connected at the turnarounds.

In some embodiments, an evaporator thermal transfer structure may be in direct thermal contact with portions of the evaporator section, and a condenser thermal transfer structure may be in direct thermal contact with portions of the condenser section. In some cases, portions of the evaporator section adjacent the liquid return path is free of contact with the evaporator thermal transfer structure, and portions of the condenser section adjacent the vapor supply path is free of contact with the condenser thermal transfer structure. This may reduce heat transfer in these portions of the sections.

In another aspect, a thermosiphon cooling device includes an evaporator section including at least one evaporation channel arranged to receive heat and evaporate a liquid in the at least one evaporation channel and a liquid return path for delivering condensed liquid to the at least one evaporation channel, and a condenser section including at least one condensing channel arranged to transfer heat from evaporated liquid to a surrounding environment to condense the evaporated liquid and a vapor supply path for delivering evaporated liquid to the at least one condensing channel. A single manifold may have a vapor chamber fluidly connecting the at least one evaporation channel with the vapor supply path and a liquid chamber fluidly connecting the at least one condensing channel with the liquid return path such that the vapor chamber and the liquid chamber are separated by a separation wall in the manifold.

In some embodiments, the single manifold includes an outer wall that defines an interior cavity and the separation wall is positioned in the interior cavity to separate the interior cavity into the vapor chamber and the liquid chamber. The outer wall may have a plurality of openings each to receive a corresponding evaporator section or condenser section, e.g., one or more evaporator sections may be received at a corresponding one of the plurality of openings and engage the separation wall such that the at least one evaporation channel is in fluid communication with the vapor chamber and the liquid return path is in fluid communication with the liquid chamber. Similarly, one or more condenser sections may be received at a corresponding one of the plurality of openings and engage the separation wall such that the at least one condensing channel is in fluid communication with the liquid chamber and the vapor supply path is in fluid communication with the vapor chamber. The separation wall may include a plurality of vapor chamber openings that each receive a corresponding portion of a condenser section that includes the vapor supply path, and a plurality of liquid chamber openings that each receive a corresponding portion of an evaporator section that includes the liquid return path, e.g., so that the evaporation channels and the liquid return path are on opposite sides of the separation wall, and the condensing channels and the vapor supply path are on opposite sides of the separation wall.

As noted above, the evaporator and condenser sections may be formed as a single, integrated part, e.g., including a plurality of evaporation channels and the liquid return path, or a plurality of condensing channels and the vapor supply path, arranged in parallel with the liquid return path or vapor supply path at one edge of the section. Also, evaporator thermal transfer structure may be in direct thermal contact with portions of the evaporator section, and condenser thermal transfer structure may be in direct thermal contact with portions of the condenser section. Portions of the evaporator section adjacent the liquid return path may be free of contact with the evaporator thermal transfer structure, and portions of the condenser section adjacent the vapor supply path may be free of contact with the condenser thermal transfer structure.

In another aspect, a thermosiphon cooling device includes an evaporator section including at least one evaporation channel arranged to receive heat and evaporate a liquid in the at least one evaporation channel and a liquid return path for delivering condensed liquid to the at least one evaporation channel, and a condenser section including at least one condensing channel arranged to transfer heat from evaporated liquid to a surrounding environment to condense the evaporated liquid and a vapor supply path for delivering evaporated liquid to the at least one condensing channel. A manifold may fluidly connect the at least one evaporation channel with the vapor supply path and fluidly connect the at least one condensing channel with the liquid return path. Conductive thermal transfer structure may be arranged to conductively transmit heat with respect to the at least one evaporation channel and/or the at least one condensing channel such that the conductive thermal transfer structure is in conductive thermal contact only with a portion of the evaporator section adjacent the at least one evaporation channel or only with a portion of the condenser section adjacent the at least one condensing channel, and such that a portion of the evaporator section adjacent the liquid return path is free of any conductive thermal transfer structure, and a portion of the condenser section adjacent the vapor supply path is free of any conductive thermal transfer structure.

The conductive thermal transfer structure may include a plurality of fins in conductive thermal contact with the portion of the evaporator section adjacent the at least one evaporation channel, and/or in thermal contact with the portion of the condenser section adjacent the at least one condensing channel.

These and other aspects of the invention will be apparent from the following description.

BRIEF DESCRIPTION OF THE DRAWINGS

The accompanying drawings, which are incorporated in and form a part of the specification, illustrate select embodiments of the present invention and, together with the description, serve to explain the principles of the inventions. In the drawings.

DETAILED DESCRIPTION

Figure 1:
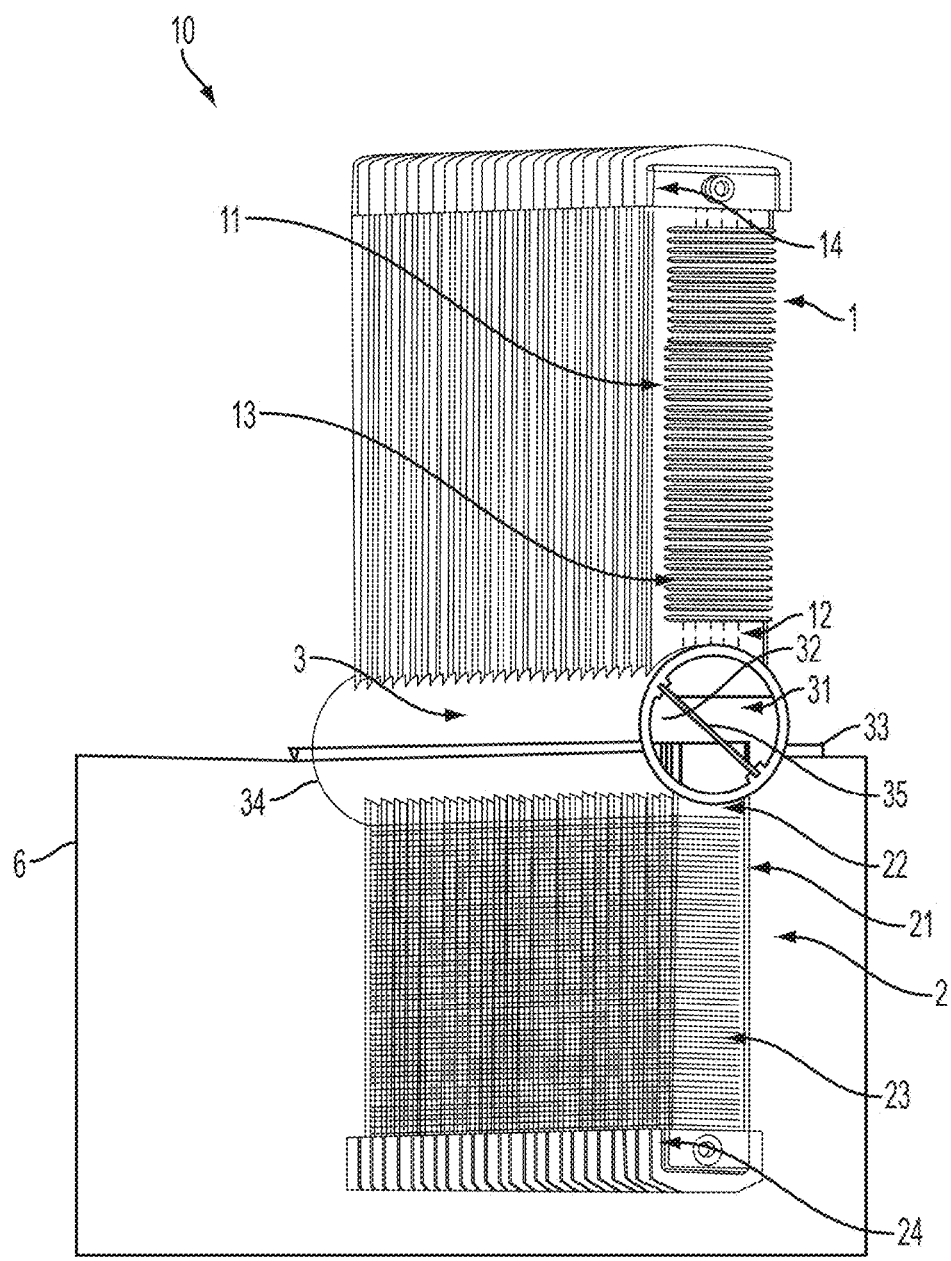
FIG. 1 is a perspective view of a thermosiphon device in an illustrative embodiment that incorporates aspects of the invention.

Aspects of the invention are not limited in application to the details of construction and the arrangement of components set forth in the following description or illustrated in the drawings. Other embodiments may be employed and aspects of the invention may be practiced or be carried out in various ways. Also, aspects of the invention may be used alone or in any suitable combination with each other. Thus, the phraseology and terminology used herein is for the purpose of description and should not be regarded as limiting.

FIG. 1 shows an illustrative embodiment of a thermosiphon device 10, e.g., used to cool electronics devices in a closed cabinet or other enclosure 6. That is, as is understood by those of skill in the art, one or more evaporator sections 2 of the device 10 may be positioned in a sealed enclosure 6 along with electronics or other heat-generating devices to be cooled. One or more condensing sections 1 may be positioned outside of the sealed enclosure 6 and dissipate heat received from the evaporator section(s) 2, e.g., to air in an environment outside of the sealed enclosure 6. A flange 33 on a manifold 3 of the device 10 may be engaged with an opening of the sealed enclosure, thereby sealing the enclosure 6 and defining a dividing point between portions inside of the enclosure 6 and an environment outside of the enclosure. By providing the evaporator section(s) 2 inside the sealed enclosure 6 and the condenser section(s) 1 outside of the enclosure 6, devices in the enclosure 6 may be cooled while being contained in an environment protected from external conditions, e.g., protected from dirt, dust, contaminants, moisture, etc. Of course, use of a thermosiphon device with a sealed enclosure is not required, e.g., the device may be used in a completely open system in which heat generating devices to be cooled are thermally coupled to one or more evaporator section(s) 2 of the device 10.

In simplified form, the thermosiphon device 10 operates to cool heat generating devices by receiving heat at the evaporator section(s) 2 such that liquid in evaporation channels 22 boils or otherwise vaporizes. Heat may be received at the evaporation channels 22 by warm air (heated by the heat generating devices) flowing across a thermal transfer structure 23 that is thermally coupled to the evaporation channels 22 or in other ways, such as by a direct conductive path, one or more heat pipes, a liquid heat exchanger, etc. Vapor flows upwardly from the evaporation channels 22 into a vapor chamber 32 of a manifold 3, and then into a vapor supply path 11 of a condenser section 1. The vapor continues to flow upwardly in the vapor supply path 11 until reaching a turnaround 14 of the condenser section 1. At this point, the vapor flows downwardly into one or more condensing channels 12 of the condenser section 1, where the vapor condenses to a liquid and flows downwardly into a liquid chamber 31 of the manifold. Heat removed from the vapor during condensation may be transferred to thermal transfer structure 13 coupled to the condensing channels 12, e.g., one or more fins conductively coupled to the condenser section 1 adjacent the condensing channels 12. In turn, heat may be removed from the thermal transfer structure 13 by cool air flowing across the structure 13, by a liquid bath, a liquid heat exchanger, refrigerant coils, or other arrangement. The condensed liquid flows downwardly from the condensing channels 12 into the liquid chamber 31 and then into a liquid return path 21 of an evaporator section 2 until reaching a turnaround 24 of the evaporator section 2. The liquid then enters an evaporator channel 22 and the process is repeated.

In accordance with an aspect of the invention, the condenser section 1 and/or evaporator section 2 may be arranged as a single integrated part. That is, the condenser section 1 may include one or more condensing channels 12 and a vapor supply path 11 in a single part, e.g., an extruded tube that has two or more channels. Similarly, the evaporator section 2 may include one or more evaporation channels 22 and a liquid return path 21 formed together as a single part. Such an arrangement may simplify the device construction and assembly, e.g., by eliminating any need to separately assemble vapor supply and liquid return conduits to communicate with condensing and evaporation channels.

In accordance with another aspect of the invention, a single manifold may be used to fluidly couple both evaporator channels of an evaporator with a vapor supply path of a condenser section, and condensing channels of a condenser with a liquid return path of an evaporator section. For example, in the FIG. 1 embodiment, the manifold 3 includes an outer wall 34 that defines an internal space. In this embodiment, the outer wall 34 has a cylindrical shape, but any other suitable shape is possible. A separation wall 35 is arranged in the manifold 3 to separate the internal space into the liquid chamber 31 and the vapor chamber 32. This arrangement provides a simple and effective way to fluidly couple portions of the thermosiphon device 10. Also, as explained in more detail below, the separation wall 35 may engage with condenser and evaporator sections 1, 2 so as to fluidly couple condenser channels 12 and the liquid return path 21 with the liquid chamber 31 and fluidly couple evaporator channels 22 and the vapor supply path 11 with the vapor chamber 32. As a result, assembly can be simplified and the number of parts and/or assembly steps to make needed fluid connections can be minimized.

Figure 2:
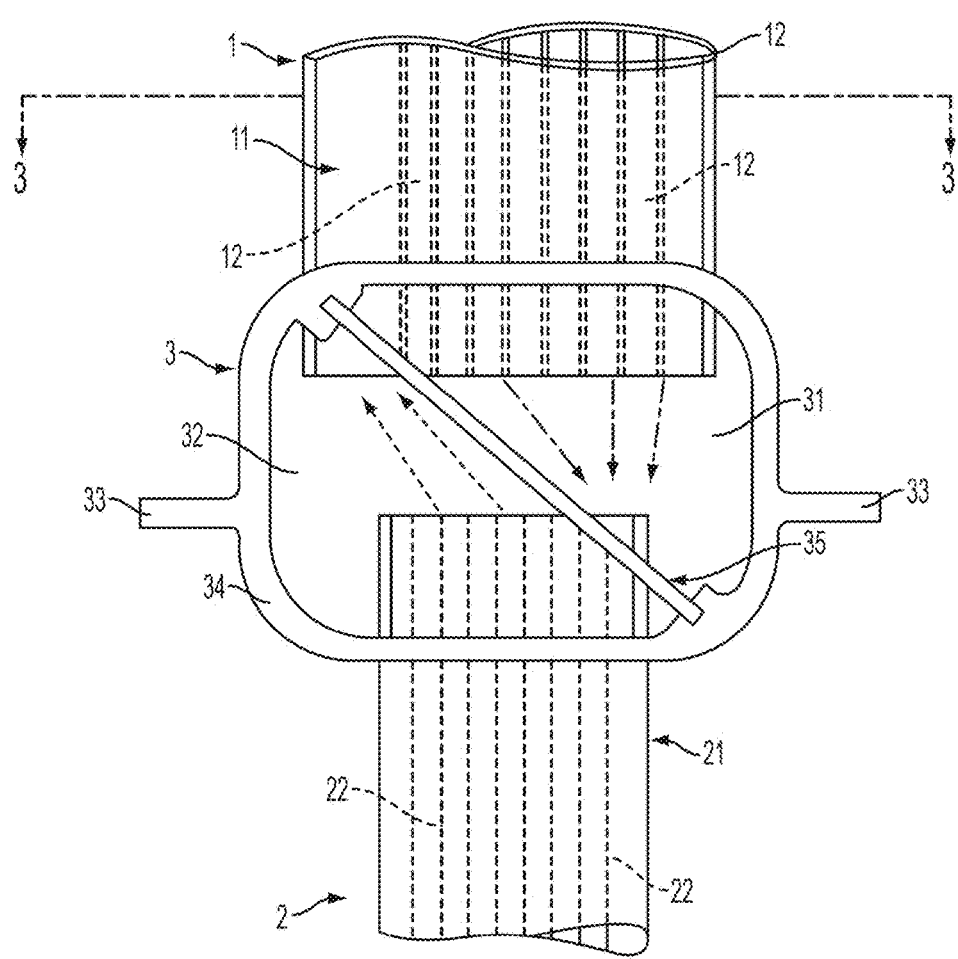
FIG. 2 shows a cross sectional view of a manifold and separation wall engaged with evaporator and condenser sections in an illustrative embodiment.

FIG. 2 shows a cross sectional view of a manifold 3 and separation wall 35 engaged with condenser and evaporator sections 1, 2 so as to put condensing channels 12 and the vapor supply path 11 on opposite sides of the separation wall 35, and so as to put evaporator channels 22 and the liquid return path 21 on opposite sides of the separation wall 35. In this illustrative embodiment, the condenser and evaporator sections 1, 2 are formed as flat tubes having multiple parallel channels, and a manifold end of each condenser and evaporator section 1, 2 may be inserted into the internal space of the manifold 3, e.g., through an opening in the outer wall 34. The separation wall 35 may include slots or other openings to receive a part of the manifold end of the condenser and evaporator sections 1, 2, thereby providing desired communication of the different portions of the condenser and evaporator sections 1, 2 with the vapor and liquid chambers 32, 31. For example, the separation wall 35 may include a liquid chamber slot or opening that receives a portion of the evaporator section 2 (on the right in FIG. 2) that defines the liquid return path 21. However, parts of the evaporator section 2 (on the left in FIG. 2) that define the evaporation channels 22 are not received in the liquid chamber slot or opening of the separation wall 35. As a result, the liquid return path 21 is put in communication with the liquid chamber 31 and the evaporation channels 22 are put in communication with the vapor chamber 32. Similarly, the separation wall 35 may include a vapor chamber slot or opening to receive a portion of the condenser section 1 (on the left in FIG. 2) that defines the vapor supply path 11, but not portions that define the condenser channels 12 (on the right in FIG. 2). Thus, the vapor supply path 11 is put in fluid communication with the vapor chamber 32 and the condensing channels 12 are put in fluid communication with the liquid chamber 31. Although in this embodiment, the separation wall 35 is formed as a flat plate that is received into corresponding grooves formed in the inner side of the outer wall 34, other arrangements are possible. For example, the separation wall 35 need not be flat, but may be curved or otherwise shaped in any suitable way. If used, grooves in the inner side of the outer wall 34 may be formed by scoring, broaching, casting, extruding or other techniques.

Figure 3:
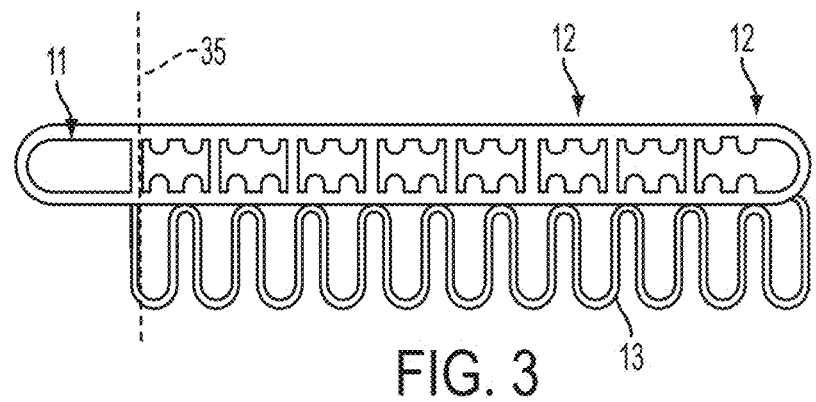
FIG. 3 shows a cross sectional view along the line 3-3 in FIG. 2.

FIG. 3 shows a cross sectional view of the condenser section 1 in FIG. 2 along the line 3-3 and illustrates an embodiment that incorporates another aspect of the invention. That is, in this embodiment, thermal transfer structure 13 (in this case, fins) is arranged to be in direct, thermally conductive communication with a portion of the body of the condenser section 1 that is adjacent to the condensing channels 12. For example, the fins may be brazed, soldered or otherwise put in direct, thermally conductive contact with the body of the condenser section 1. However, portions of the condenser section 1 body that are adjacent the vapor supply path 11 are free of thermal transfer structure 13. In fact, these portions of the condenser section 1 body adjacent the vapor supply path 11 may be made of thermally insulating material and/or be coated or otherwise covered by a thermally insulating material to minimize heat transfer. By having portions of the condenser section 1 adjacent the vapor supply path 11 free of thermal transfer structure 13, vapor in the vapor supply path 11 may cool or otherwise lose heat much more slowly than otherwise, thereby allowing the vapor to remain in vapor form until provided into a condensing channel 12. This may help maintain desired cyclical flow in the thermosiphon device 10. In other arrangements, the thermal transfer structure 13 may extend over areas adjacent the vapor supply path 11, e.g., to increase the surface area of the structure 13, but the structure 13 may not be in direct, conductive thermal contact with the portions adjacent the vapor supply path 11. For example, in FIG. 3, the fins may extend to the left over the vapor supply path 11, but not be in direct thermally conductive contact with the condenser section 1 adjacent the path 11. This may increase the surface area of the fin, and thus improve its heat transfer characteristics, but reduce heat transfer with respect to the vapor supply path 11.

Although the thermal transfer structure 13 is shown as including one or more fins on one side of the condenser section 1, other arrangements are possible, such as having fins on both sides of the condenser section 1, providing a cold plate or other liquid heat exchanger portion in contact with the condenser portions, providing ice or other relatively cold liquid or solid phase-changing material in contact with the condenser portions, etc. Also, it should be understood that the evaporator section 1 may be similarly, or alternately, arranged to have thermal transfer structure 23 only in direct thermally conductive contact with portions of the evaporator section 2 body that are adjacent the evaporation channels 22, and not in contact with the liquid return path 21. As also described above, the portions of the evaporator section 2 body adjacent the liquid return path 21 may be insulated or otherwise arranged to minimize heat transfer. As will be understood, this can help reduce heat transfer to the liquid in the liquid return path 21, helping to maintain the liquid form until the liquid reaches an evaporation channel 22. This arrangement can be seen in FIG. 1, which shows the thermal transfer structure 23 absent over the area of the liquid return path 21, and which shows the thermal transfer structure 13 absent over the area of the vapor supply path 11.

In another aspect of the invention, heat may be removed from the condenser section 1, or transferred to evaporator section 2, in other ways that helps reduce heat transfer with the vapor supply path 11 and/or the liquid return path 21 or otherwise provides a higher heat transfer rate for condensing channels 12 or evaporation channels 22 than for the vapor supply path 11 or the liquid return path 21. For example, as shown in FIG. 3, the condensing channels 12 (or evaporation channels 22) may be provided with a larger surface area presented to the channel interior, e.g., by a curved or other surface, than the vapor supply path 11. This may help increase heat transfer from vapor in the channels 12 to the body of the condenser section 1. This technique could be used for the evaporator section(s) 2 as well. As another example, in the FIG. 1 embodiment cooling air flow may be directed over the condenser sections 1 in a right to left direction, and warm air flow may be directed over the evaporator sections 2 in a left to right direction. In this way, cooling air flow flows first over the thermal transfer structure 13 and is warmer when it reaches the vapor supply path 11, and warm air flow flows first over the thermal transfer structure 23 and is cooler when it reaches the liquid return path 21. In short, any heat transfer configuration that minimizes heat transfer with the vapor supply path 11 and/or the liquid return path 21 may be useful, particularly when implementing integrated condenser and/or evaporator sections.

Figure 4:
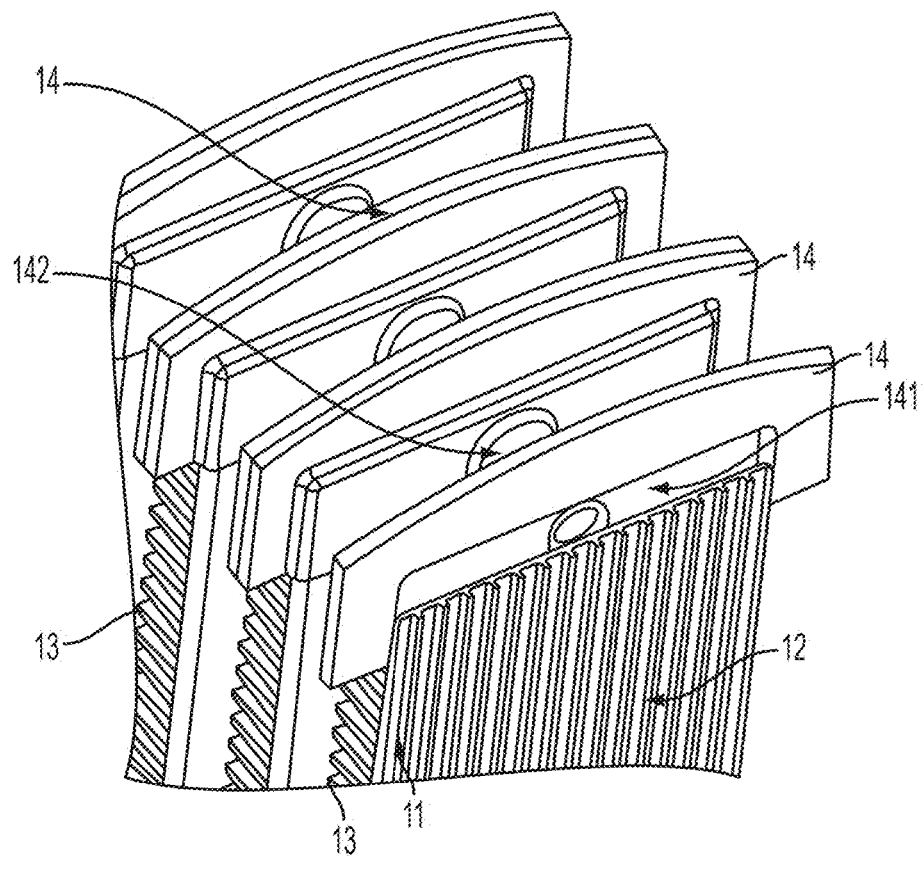
FIG. 4 shows a close up view of the upper end of the condenser sections of the FIG. 1 embodiment.
Figure 5:
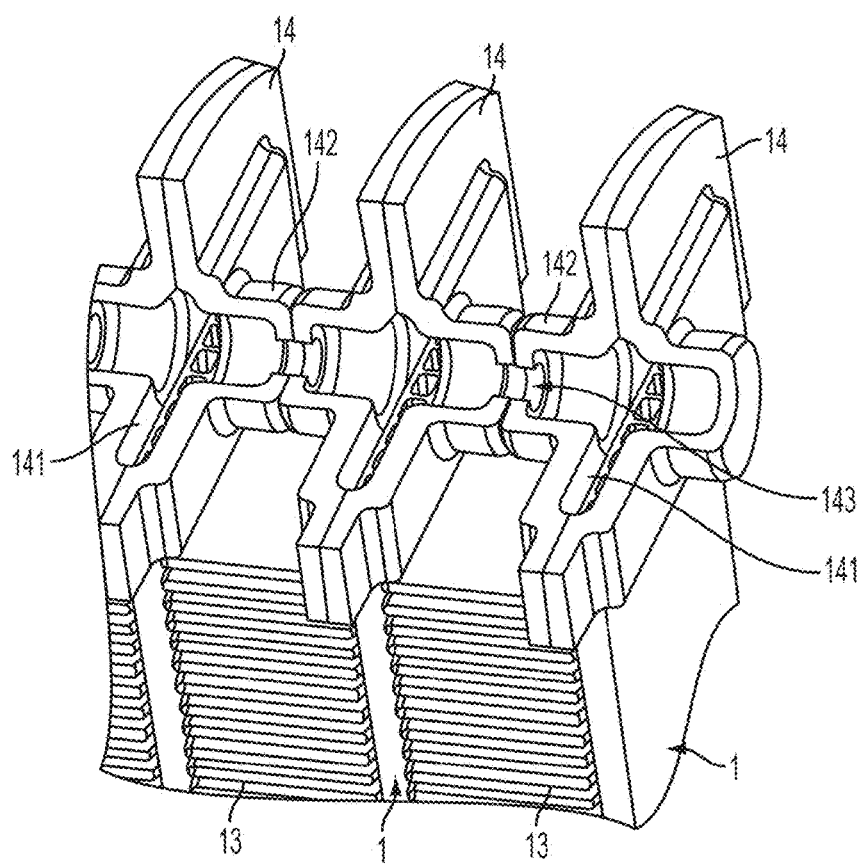
FIG. 5 shows a close up view with partial cross section of the upper end of the condenser sections of the FIG. 1 embodiment.
Figure 6:
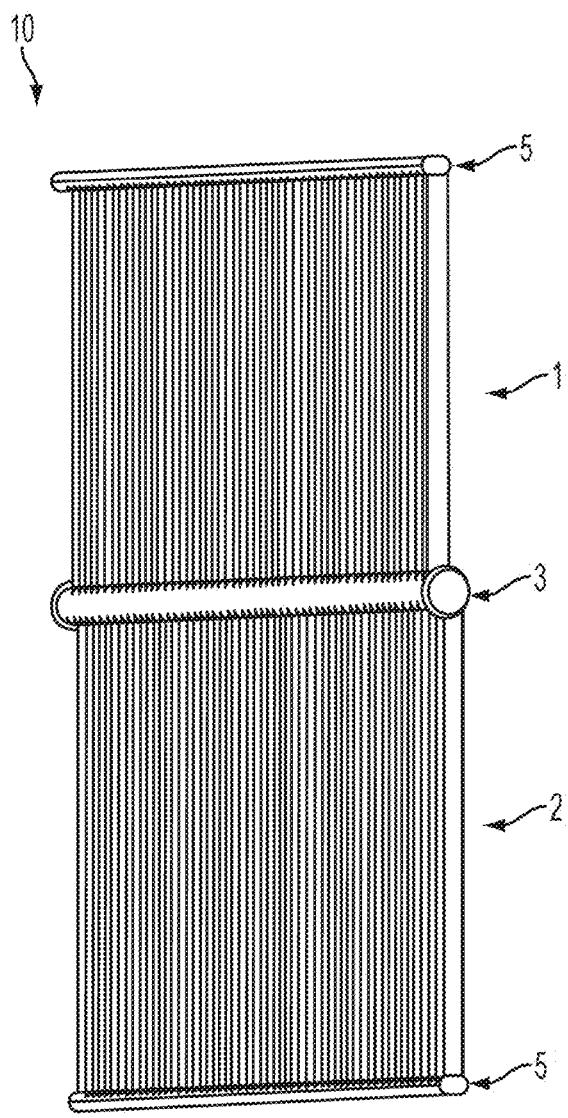
FIG. 6 shows a perspective view of another illustrative embodiment including manifolds at turnaround ends of the condenser and evaporator sections.

In at least some embodiments, fluidly coupling the vapor supply path 11 with the condensing channels 12 at the turnaround end of the condenser section(s) 1 and fluidly coupling the liquid return path 21 with the evaporator channels 22 at the turnaround end of the evaporator section(s) 2 may be done in a relatively simple way. For example, FIG. 4 shows a close up view of the turnaround 14 of the condenser sections 1 of the FIG. 1 embodiment which in this arrangement are formed as a cap. Note that the frontmost turnaround cap 14 and condenser section 1 are shown in cross section such that a cavity 141 defined by the turnaround 14 that fluidly connects the vapor supply path 11 and the condenser channels 12 can be seen. The turnarounds 14 each have an opening on a bottom side that receives a turnaround end of the condenser section 1. Also, in this embodiment, the turnarounds 14 includes a communication port 142 that allows for fluid communication between the cavities 141 of adjacent turnarounds 14. This may allow for pressure equalization across the condenser sections 1. FIG. 5 shows a partial sectional view of the turnarounds 14 and better illustrates how the communication ports 142 may be joined together (e.g., by brazing, an adhesive, etc.) so as to define a channel 143 between adjacent cavities 141. Note that, although not shown, the turnarounds 24 of the evaporator section(s) 2 may be arranged in the same way as the turnarounds 14, e.g., as a cap that covers the end of a respective evaporator section 2 and provides for fluid communication between the liquid return path 21 and the evaporation channel(s) 22. The turnarounds 24 may include communication ports 142 like the turnarounds 14 in FIGS. 4 and 5, but of course, the communication ports 142 are not required or could be configured in other ways. For example, FIG. 6 shows another illustrative embodiment in which the turnaround ends of the condenser sections 1 and the evaporator sections 2 are connected to tubular manifolds 5 that extend between multiple condenser sections 1 and evaporator sections 2. Thus, the manifolds 5 connect the vapor return path 11 and condenser channels 12 of each condenser section 1, or connect the liquid return path 21 and evaporation channels 22 of each evaporator section 2, to each other and with the paths and channels of other condenser and evaporator sections 1, 2. In other embodiments, a cap type turnaround 14, 24 need not communicate with adjacent turnarounds 14, 24, and instead may communicate only with its corresponding condenser/evaporator section 1, 2.

Figure 7:
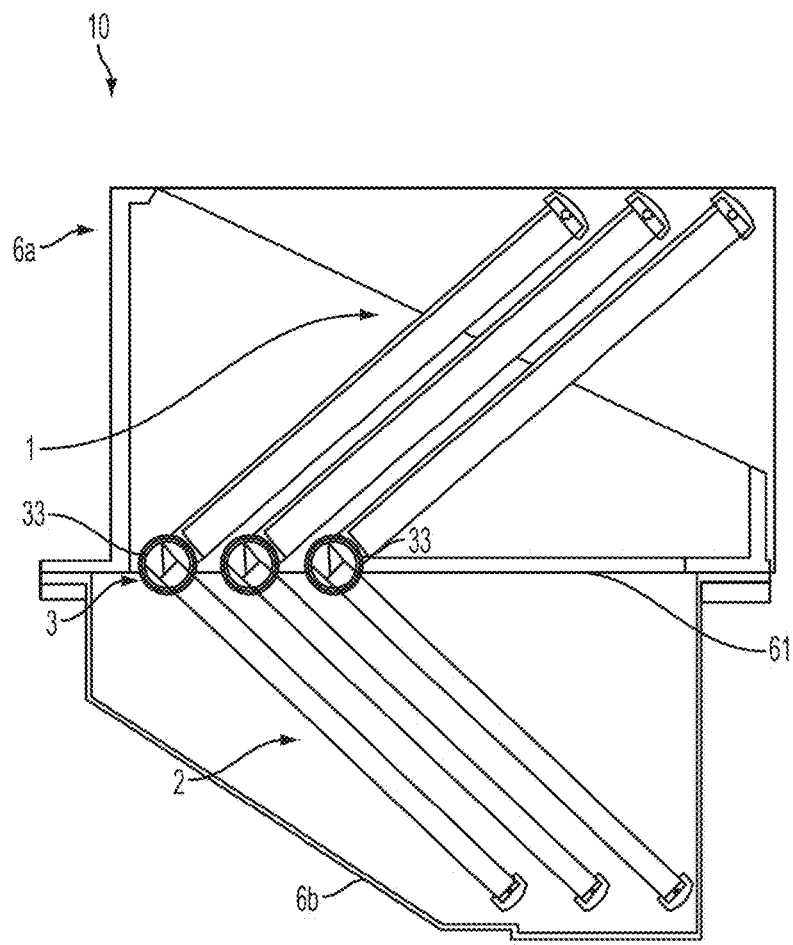
FIG. 7 shows a side view of a cooling device including three thermosiphon devices.

While in the embodiments above, the thermosiphon devices 10 are arranged as planar structures, such an arrangement is not necessary, and the condenser and evaporator sections 1, 2 may be arranged at any suitable angle relative to each other. For example, FIG. 7 shows an illustrative embodiment in which a cooling device includes three thermosiphon devices 10 that have condenser and evaporator sections 1, 2 arranged at a 90 degree angle to each other. In this embodiment, the device 10 is associated with an enclosure 6 that includes upper and lower enclosures 6a, 6b separated by a wall 61. The evaporator sections 2 of the devices 10 are arranged in the lower enclosure 6b that is sealed from an external environment, and the condenser sections 1 are arranged in the upper enclosure 6a which is isolated from the lower enclosure 6b by the wall 61 to which the flanges 33 of the manifolds 3 may be connected. The upper enclosure 6a may, or may not, be isolated from an external environment. For example, cooling air flow may enter from outside of the upper enclosure 6a and pass over the condenser sections 1, e.g., by a fan blowing air into the upper enclosure 6a. Of course, this is just one illustrative embodiment and others are possible.

Figure 8:
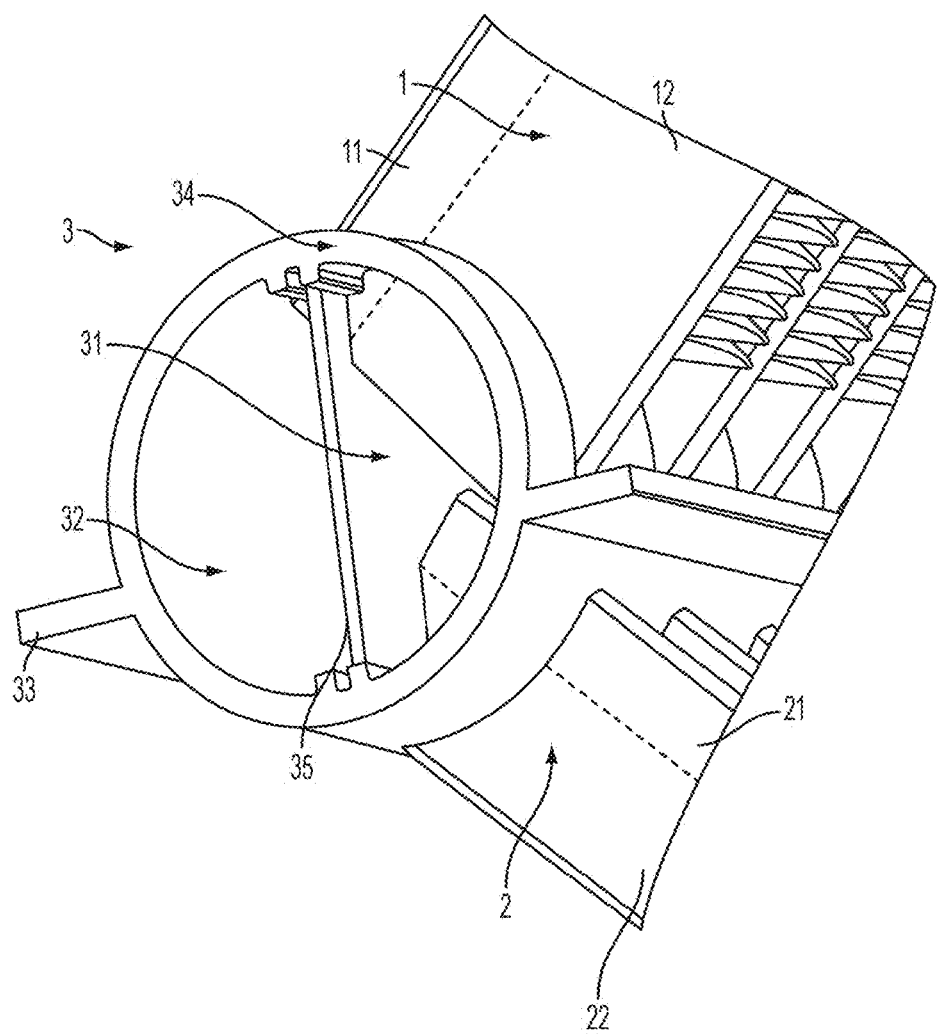
FIG. 8 shows a close up view of the manifold of the FIG. 7 thermosiphon devices.
Figure 9:
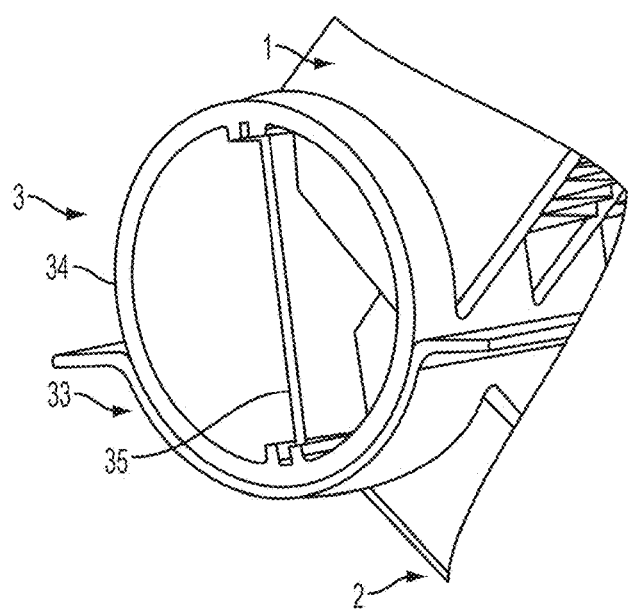
FIG. 9 shows a close up view of an alternative manifold arrangement with a flange formed as a cladding sheet.
Figure 10:
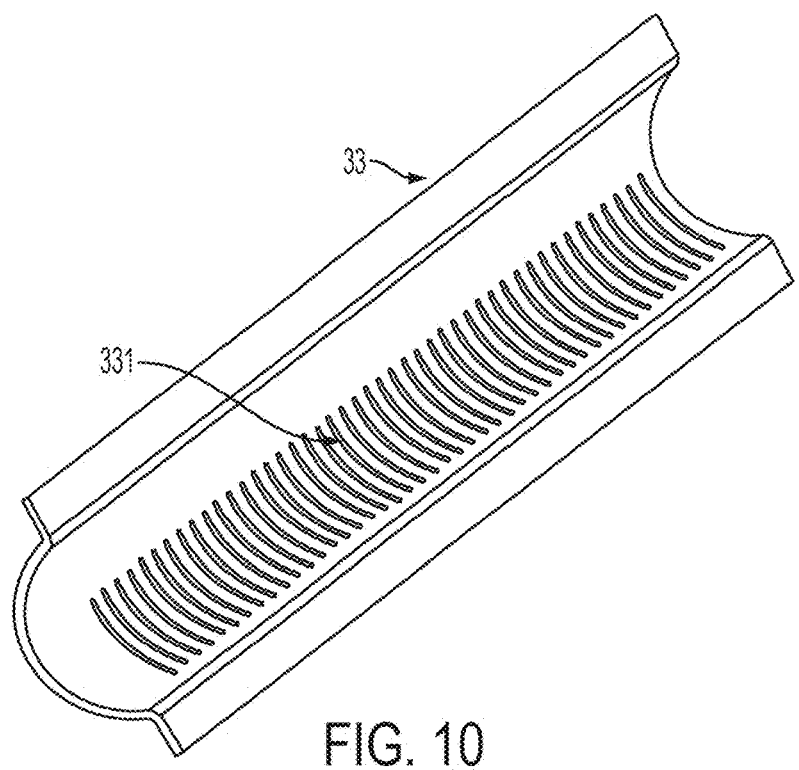
FIG. 10 shows the cladding sheet flange of the FIG. 9 embodiment.
Figure 11:
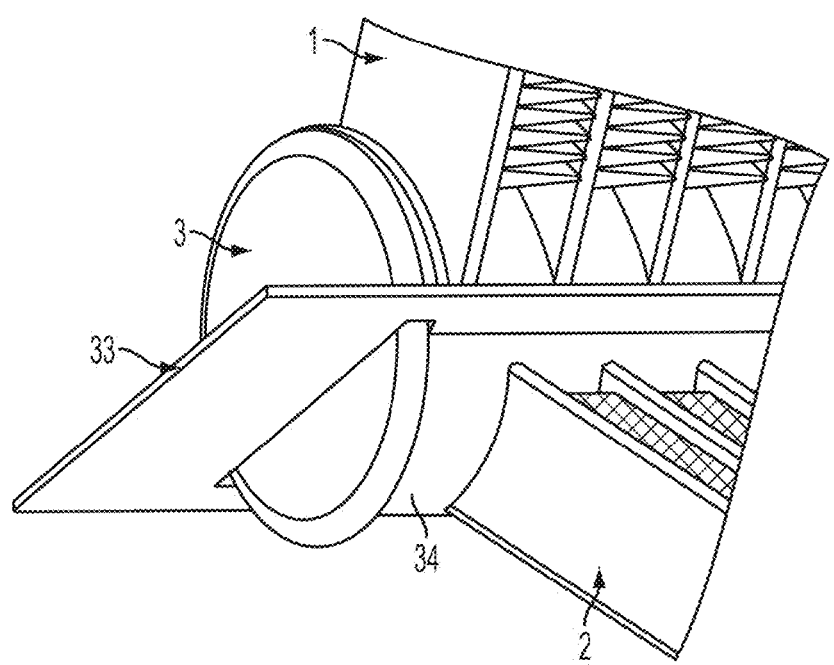
FIG. 11 shows another flange arrangement formed as a flat sheet.

FIG. 8 shows a close up view of a manifold 3 of one of the thermosiphon devices 10 of the FIG. 7 embodiment. This arrangement is somewhat similar to that in FIG. 1, but the engagement of the condenser and evaporator sections 1, 2 with the manifold 3 and the separation wall 35 is modified slightly to accommodate the angled configuration of the device 10. As in the FIG. 1 embodiment, the flanges 33 are formed as a single part with the outer wall 34, but this is not required, e.g., the flanges 33 could be eliminated or modified in other ways. For example, FIG. 9 shows an embodiment in which the flange 33 is configured as a curved plate or cladding that is attached to an exterior side of the outer wall 34 of the manifold 3. FIG. 10 shows a perspective view of the flange 33 separate from the manifold 3 and illustrates a series of openings 331 formed in the flange 33 through which the evaporator sections 2 may be inserted. However, multiple openings 331 one for each evaporator section 2 is not required, and FIG. 11 shows an embodiment in which the flange 33 is formed as a flat plate with a single opening that receives the manifold 3. That is, the flange 33 may receive the manifold 3 in its central opening such that portions of the flange 33 extend away from the manifold 3 in areas between the condenser and evaporator sections 1, 2. As in other embodiments, the flange 33 can be secured to the manifold 3 and/or the evaporator or condenser sections 2, 1, e.g., by brazing, adhesive, etc.

Figure 12:
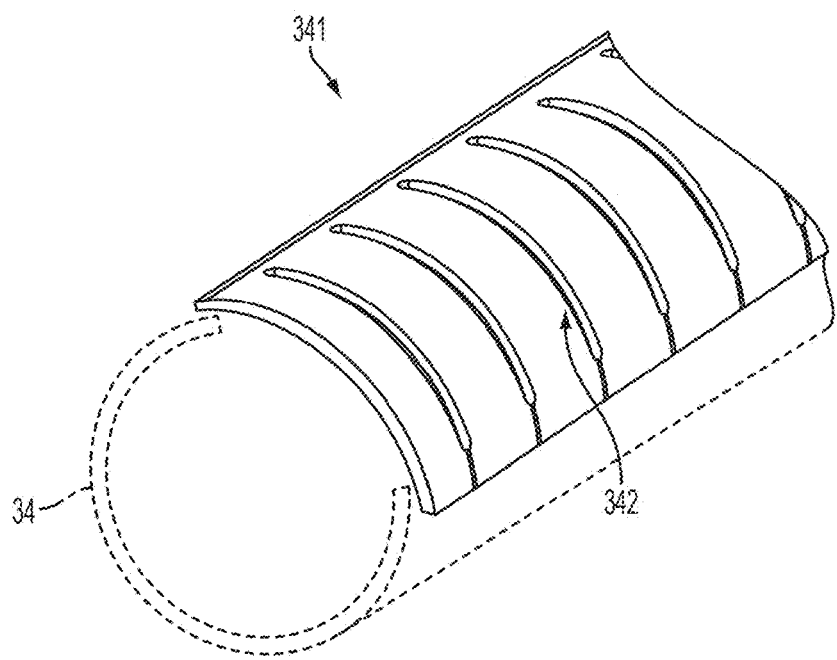
FIG. 12 shows an embodiment for providing evaporator or condenser section receiving openings in a cladding sheet.
Figure 13:
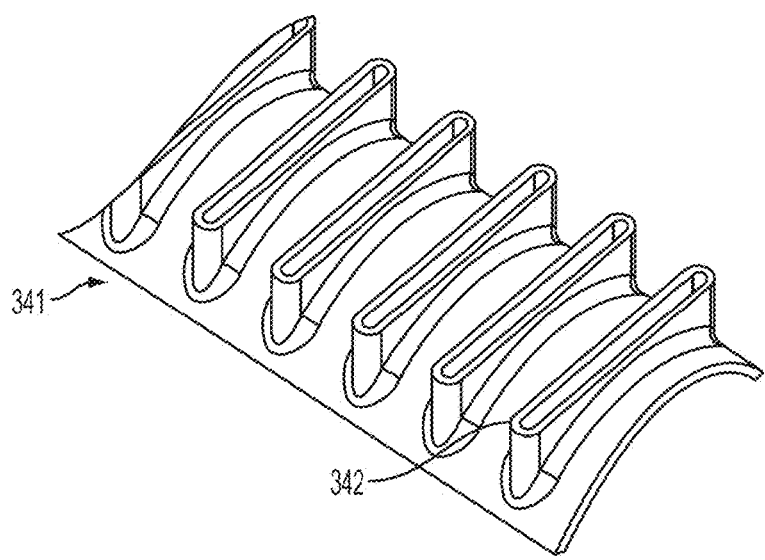
FIG. 13 shows a close up view of an alternate arrangement for providing evaporator or condenser section receiving openings in a manifold.

While in the embodiments above, the outer wall 34 of the manifold 3 is made as a single part, other arrangements are possible. For example, FIG. 12 shows an embodiment in which the manifold 3 is made in two parts including an outer wall 34 that has a C-shaped cross section and a curved plate 341 including multiple openings 342 to receive condenser or evaporator sections 1, 2. Such an arrangement may allow for easier assembly in some situations, e.g., by allowing the curved plate 341 to be assembled on condenser or evaporator sections 1, 2 prior to being assembled with the outer wall 34. In another embodiment, the curved plate 341 may incorporate the flanges 33, e.g., be formed in a way like that shown in FIGS. 9 and 10. Alternately, the manifold 3 may include two curved plates 341 like that shown in FIG. 12, i.e., one for condenser sections 1, and another for evaporator sections 2 that are joined together to form the manifold 3. While simple slot type openings 342 shown in FIG. 12 may be used to receive condenser or evaporator sections 1, 2 at the manifold 3, other arrangements are possible, such as that shown in FIG. 13. The openings 342 in FIG. 13 may help properly align condenser or evaporator sections 1, 2 with the manifold 3, may be formed in any suitable way, such as by drawing, machining, molding, etc., and may be provided in a single piece manifold 3 or in an arrangement like that in FIG. 12. If a flange 33 and/or manifold parts (such as the plates 341) are provided in a cladding-type form, the parts may be joined together and to the condenser/evaporator sections 1, 2 in a single operation, e.g., a brazing operation that joins all manifold 3, flange 33, and evaporator/condenser sections 2, 1 at a same time. Thermal transfer structure 13, 23 and/or turnarounds 14, 24 may be joined to the condenser/evaporator sections 1, 2 as part of the same, single operation. Thus, all or several of the parts of a thermosiphon device 10 may be assembled together and then fixed in a single operation, such as brazing, soldering, or other technique.

Figure 14:
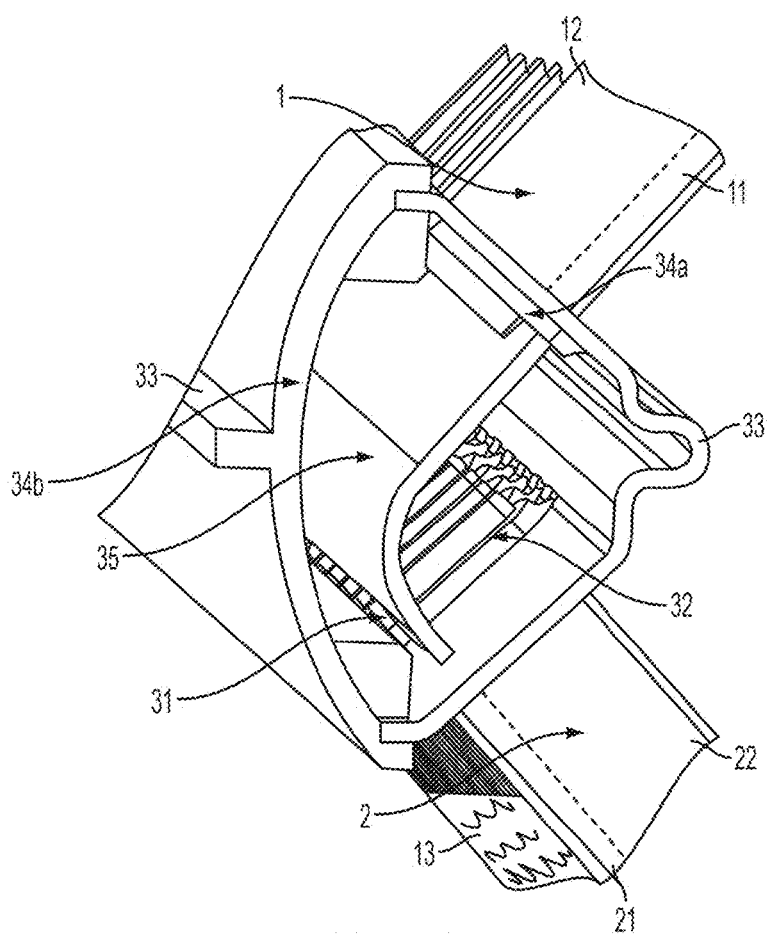
FIG. 14 shows an embodiment of a manifold in which an outer wall is formed of two parts.

FIG. 14 shows yet another illustrative embodiment for a manifold 3. In this arrangement, the manifold 3 includes two wall sections 34a and 34b, which may be stamped, molded, drawn, machined or otherwise formed. The first wall section 34a is received into corresponding grooves of the second wall section 34b, but other configurations are possible, such as welding or adhering at a butt joint, and others. One advantage to the configuration in FIG. 14 is that the openings needed to receive the condenser and evaporator sections 1, 2 may be formed in the first wall section 34a prior to assembly with the second wall portion 34b and/or prior to bending or other forming of the first wall portion 34a. This configuration also allows for relatively easy placement of the separation wall 35 in the interior space of the manifold 3 prior to attaching the first and second wall portions 34a, 34b together. This embodiment also shows that the separation wall 35 may be curved in any suitable way, and in this embodiment is configured so that open-ended slots may be formed into the ends of the separation wall 35 to receive manifold ends of the condenser and evaporator sections 1, 2 rather than closed openings as in the FIG. 2 embodiment. FIG. 14 also shows that a flange 33 may be formed as a bent part of the first wall portion 34a.

Figure 15:
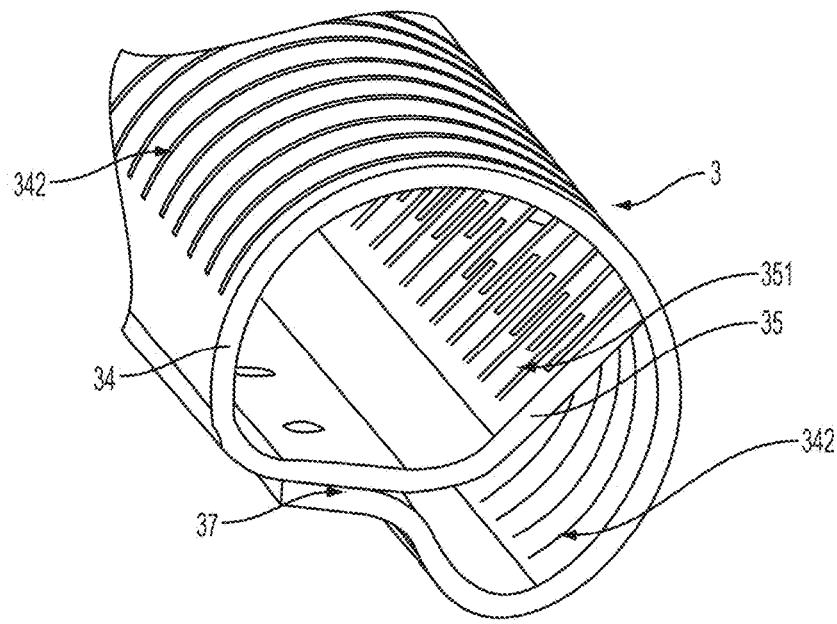
FIG. 15 shows an embodiment of a manifold in which an outer wall and a separation wall are formed from a single bent sheet.
Figure 16:
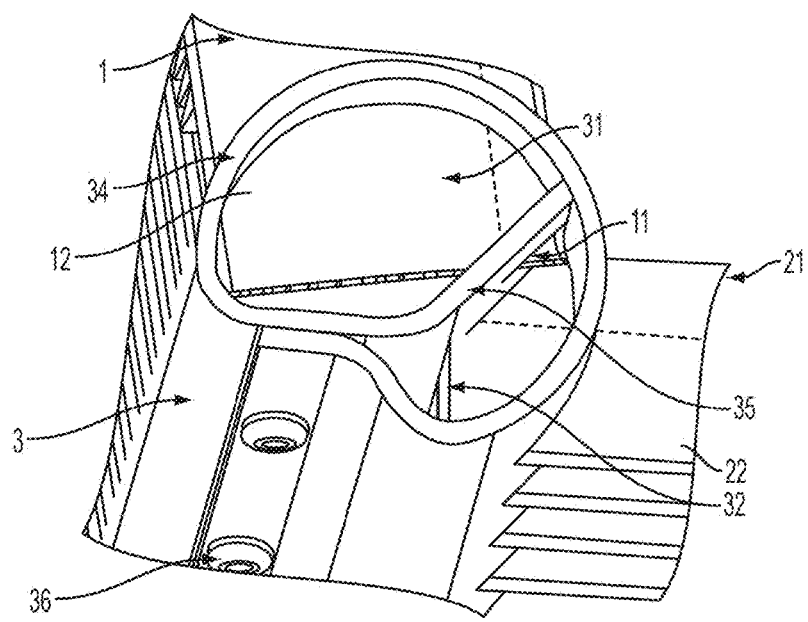
FIG. 16 shows the FIG. 15 manifold engaged with evaporator and condenser sections in an illustrative embodiment.

FIGS. 15 and 16 show another illustrative embodiment in which the manifold outer wall 34 and the separation wall 35 may be formed from a single bent sheet. As can be seen in FIG. 15, a single sheet may be formed to have openings 342 (in the outer wall 34 portion) for the condenser and evaporator sections 1, 2 as well as openings 351 (in the separation wall 35 portion) for receiving and engaging the manifold ends of the condenser and evaporator sections 1, 2 and put the evaporation/condensing channels and vapor supply/liquid return paths in fluid communication with the vapor and liquid channels 31, 32. One end of the bent sheet may be joined to another portion of the sheet at a junction 37, e.g., by one or more rivets 36 as shown in FIG. 16, welding, brazing or other techniques. The condenser and evaporator sections 1, 2 may be brazed or otherwise attached to the outer wall 34 and separation wall 35 portions, as desired and consistent with the other embodiments described above.

Figure 17:
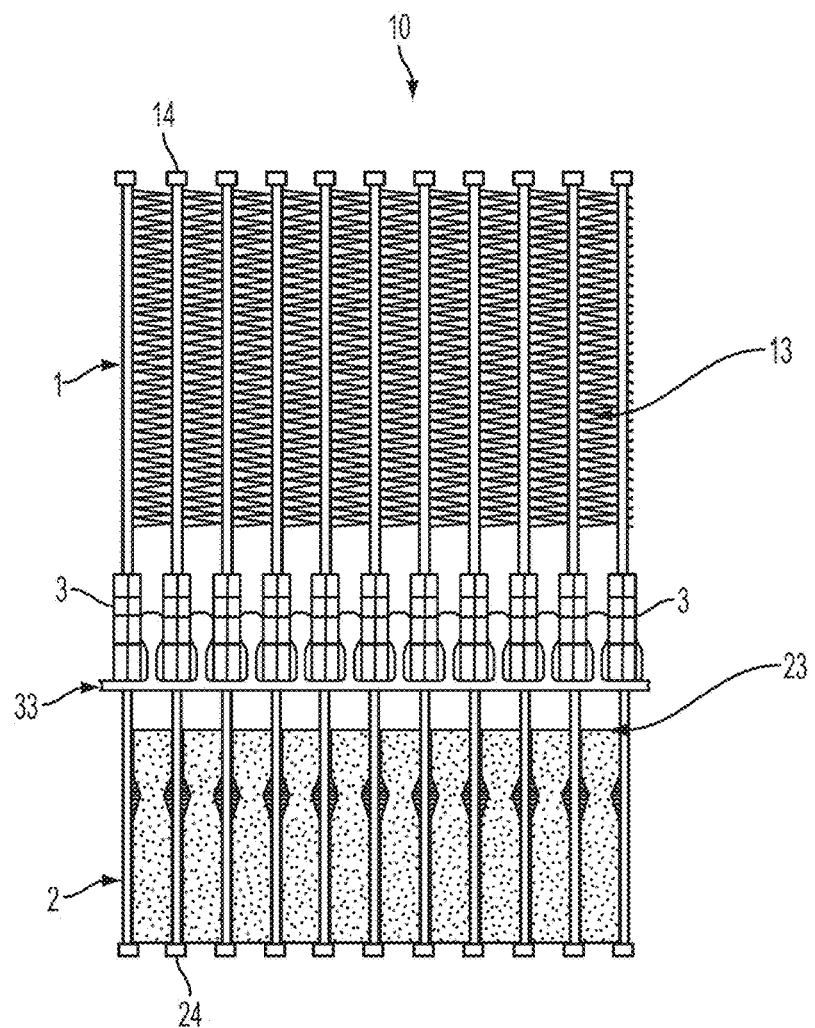
FIG. 17 shows another illustrative embodiment of a thermosiphon device including multiple manifolds.
Figure 18:
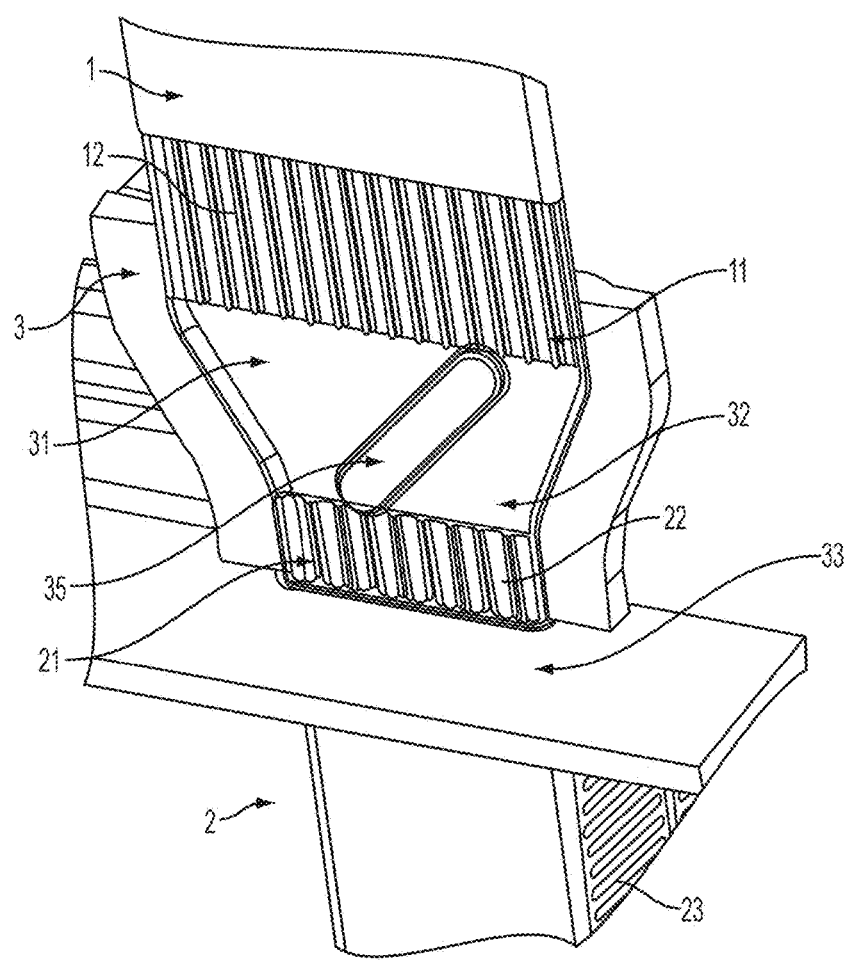
FIG. 18 shows a close up, sectional view of a manifold from the FIG. 17 embodiment.

While the embodiments above show configurations in which the manifold 3 connects to multiple condenser and evaporator sections 1, 2, this is not required. For example, FIG. 17 shows an embodiment in which a single manifold 3 interconnects respective condenser and evaporator sections 1, 2. While the individual manifolds 3 may include communication ports similar to the turnarounds 14 in FIG. 4, such connection is not required. FIG. 18 shows a cross sectional view of a manifold 3 in the FIG. 17 embodiment and illustrates how manifold ends of the condenser and evaporator sections 1, 2 are received into respective upper and lower openings of the manifold 3. The section 1, 2 ends are inserted into the openings until butted against a separation wall 35 so that the evaporator channels 22 and vapor supply line 11 are in fluid communication with the vapor chamber 32, and the condenser channels 12 and liquid return path 21 are in fluid communication with the liquid chamber 31. That is, the separation wall 35 engages with the section 1, 2 ends so that the evaporator channels 22 and liquid return path 21 are on opposite sides of the separation wall 35 and the vapor supply line 11 and the condenser channels 12 are on opposite sides of the separation wall 35. This arrangement allows for relatively easy and efficient assembly of the condenser and evaporator sections 1, 2 with the manifold 3, making not only physical mounting connections but also necessary fluid connections. This embodiment also shows that the manifold 3 has an integrated flange 33 at a lower end, which may cooperate with flanges 33 on other manifolds 3 to create an air tight barrier between the condenser and evaporator sections 1, 2, for example, in combination with an enclosure around the evaporator sections 1, 2.

Figure 19:
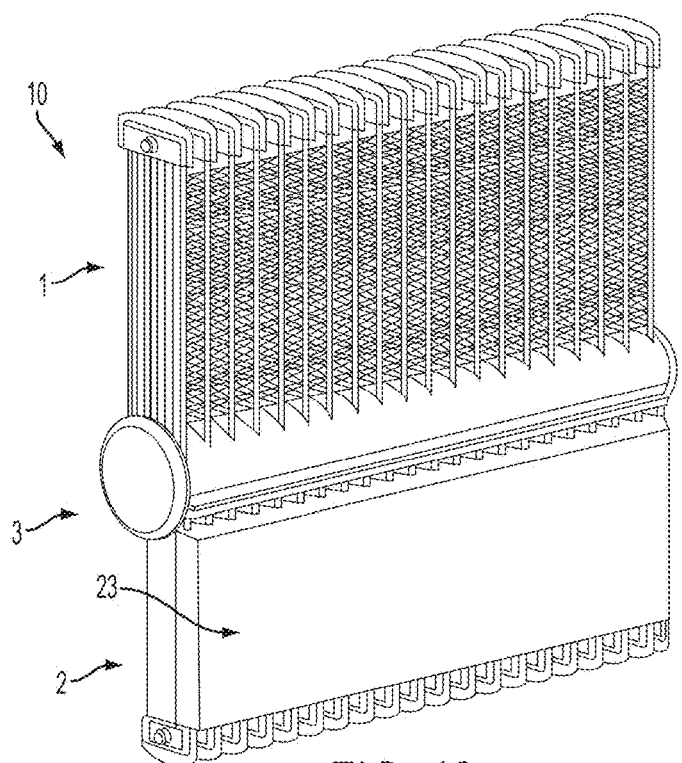
FIG. 19 shows another embodiment of a thermosiphon device including a thermal transfer structure arranged as a flat plate with slots to receive respective evaporator sections.
Figure 20:
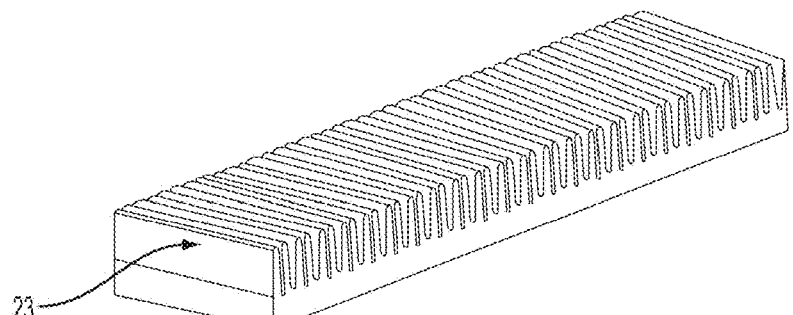
FIG. 20 shows a perspective view of the thermal transfer structure of FIG. 19.
Figure 21:
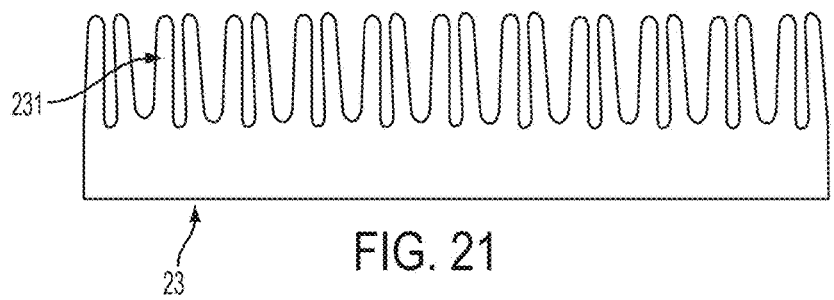
FIG. 21 shows a side view of the thermal transfer structure of FIG. 19.

As noted above, the thermal transfer structures 13, 23 are not limited to fins as shown in the illustrative embodiments. FIGS. 19-21 shows another embodiment in which the thermal transfer structure 23 for the evaporator sections 2 is formed as a generally flat plate with grooves 231 arranged to receive and thermally couple with a corresponding evaporator section 2. The thermal transfer structure 23 may be attached to the evaporator sections 2, e.g., by brazing, an adhesive, etc., which may enhance the thermal coupling between the sections 2 and the thermal transfer structure 23. Heat generating devices may be thermally coupled to the thermal transfer structure 23, e.g., on its flat surface shown in FIG. 19, e.g., the devices may be mounted directly to the structure 23. It will also be appreciated that the thermal transfer structure 23 in this embodiment may incorporate the aspect of the invention that the portion of the evaporator section 2 adjacent the liquid return path 21 (or the vapor supply path 11 if used with a condenser section 1) may be free of any thermal transfer structure 23, e.g., to help reduce heat transfer to the liquid in the liquid return path 21. For example, the evaporator sections 2 may be received into the grooves 231 so that the portion forming the liquid return path 21 is not received into the groove 231, but instead protrudes from the groove 231. By sizing the groove 231 appropriately, direct thermal contact of the thermal transfer structure 23 with portions of the evaporator section 2 adjacent the liquid return path 21 may be avoided.

Figure 22:
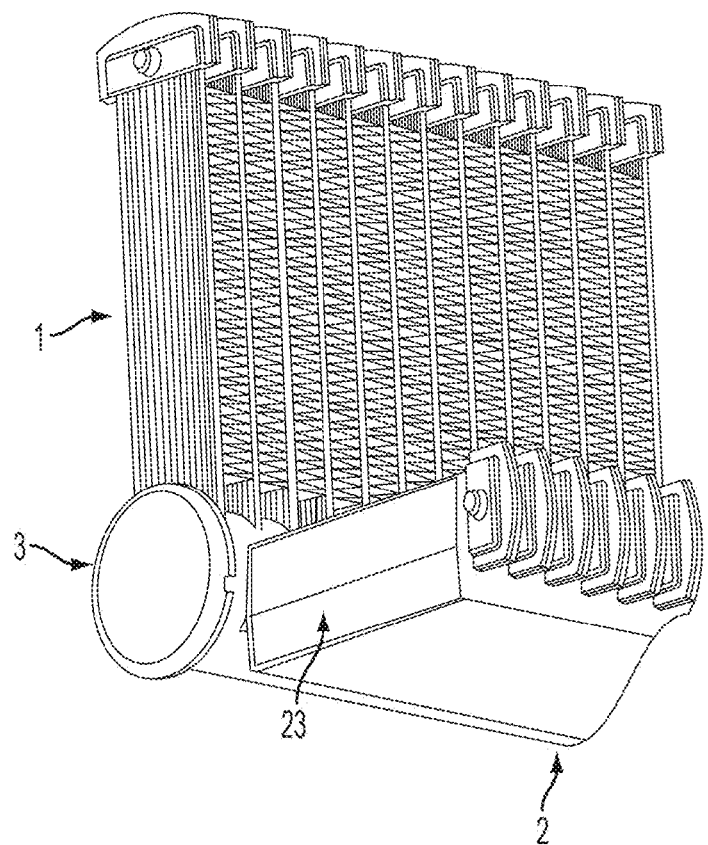
FIG. 22 shows an altered configuration of the FIG. 19 device with the evaporator and condenser sections arranged at a 90 degree angle to each other.

As with other embodiments, the FIG. 19 embodiment may have the evaporator and condenser sections 2, 1 arranged at any suitable angle, such as about 90 degrees as shown in FIG. 22. This configuration may be useful, for example, to allow the thermal transfer structure 23 to be placed on top of a heat generating device or other component from which the thermal transfer structure 23 receives heat. The thermal transfer structure 23 may be pressed (e.g., clamped) into contact with the heat source or otherwise arranged to receive heat that is removed by the thermosiphon device 10 to the condenser sections 1.

The embodiments provided herein are not intended to be exhaustive or to limit the invention to a precise form disclosed, and many modifications and variations are possible in light of the above teachings. The embodiments were chosen and described in order to best explain the principles of the invention and its practical application to thereby enable others skilled in the art to best utilize the invention in various embodiments and with various modifications as are suited to the particular use contemplated. Although the above description contains many specifications, these should not be construed as limitations on the scope of the invention, but rather as an exemplification of alternative embodiments thereof.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more"

of the elements so conjoined. Other elements may optionally be present other than the elements specifically identified by the "and/or" clause, whether related or unrelated to those elements specifically identified.

The use of "including," "comprising," "having," "containing," "involving," and/or variations thereof herein, is meant to encompass the items listed thereafter and equivalents thereof as well as additional items.

It should also be understood that, unless clearly indicated to the contrary, in any methods claimed herein that include more than one step or act, the order of the steps or acts of the method is not necessarily limited to the order in which the steps or acts of the method are recited.

While aspects of the invention have been described with reference to various illustrative embodiments, such aspects are not limited to the embodiments described. Thus, it is evident that many alternatives, modifications, and variations of the embodiments described will be apparent to those skilled in the art. Accordingly, embodiments as set forth herein are intended to be illustrative, not limiting. Various changes may be made without departing from the spirit of aspects of the invention.

What is claimed:

1. A thermosiphon cooling device including:
   an evaporator section including at least one evaporation channel arranged to receive heat and evaporate a liquid in the at least one evaporation channel and a liquid return path for delivering condensed liquid to the at least one evaporation channel;
   a condenser section including at least one condensing channel arranged to transfer heat from evaporated liquid to a surrounding environment to condense the evaporated liquid and a vapor supply path for delivering evaporated liquid to the at least one condensing channel; and
   a manifold having a vapor chamber fluidly connecting the at least one evaporation channel with the vapor supply path and a liquid chamber fluidly connecting the at least one condensing channel with the liquid return path, the vapor chamber and the liquid chamber being fluidly separated by a separation wall in the manifold to enable cyclical flow in the thermosiphon cooling device from the vapor chamber to the vapor supply path, the at least one condensing channel, the liquid chamber, the liquid return path, the at least one evaporation channel, and back to the vapor chamber,
   wherein the at least one evaporation channel and the liquid return path are integrated into a single unitary part OR the at least one condensing channel and the vapor supply path are integrated into a single unitary part.

2. The device of claim 1, wherein the manifold includes an outer wall that defines an interior cavity.

3. The device of claim 2, wherein the outer wall includes a plurality of openings each to receive a manifold end of a corresponding evaporator section or condenser section.

4. The device of claim 3, wherein the evaporator section is received at a corresponding one of the plurality of openings and engages the separation wall such that the at least one evaporation channel is in fluid communication with the vapor chamber and the liquid return path is in fluid communication with the liquid chamber.

5. The device of claim 4, wherein the condenser section is received at a corresponding one of the plurality of openings and engages the separation wall such that the at least one condensing channel is in fluid communication with the liquid chamber and the vapor supply path is in fluid communication with the vapor chamber.

6. The device of claim 5, wherein the device includes a plurality of evaporator sections and a plurality of condenser sections each received at a corresponding one of the plurality of openings and engaged with the separation wall.

7. The device of claim 1, wherein the device includes a plurality of evaporator sections and a plurality of condenser sections, wherein each evaporator section is formed as a single, integrated part including a plurality of evaporation channels and the liquid return path, and each condenser section is formed as a single integrated part including a plurality of condensing channels and the vapor supply path.

8. The device of claim 7, wherein the plurality of evaporation channels and the liquid return path are arranged in parallel with the liquid return path at one edge of the evaporator section, and wherein the plurality of condensing channels and the vapor supply path are arranged in parallel with the vapor supply path at one edge of the condenser section.

9. The device of claim 7, wherein each evaporator section and each condenser section has a respective manifold end engaged with the manifold that is opposite a turnaround, and wherein a cap closes the turnaround and fluidly couples the respective evaporation channels or condensing channels with the corresponding liquid return path or vapor supply path.

10. The device of claim 9, further comprising a plurality of evaporator sections and a plurality of condenser sections, and wherein each cap includes a conduit for fluid communication with an adjacent cap corresponding to another evaporator section or condenser section.

11. The device of claim 7, wherein each evaporator section is formed as a flat tube with a plurality of channels that define multiple evaporator channels and the liquid return path, and each condenser section is formed as a flat tube with a plurality of channels that define multiple condenser channels and the vapor supply path.

12. The device of claim 2, wherein the evaporator section is formed as a single, integrated part including a plurality of evaporation channels and the liquid return path, and the condenser section is formed as a single integrated part including a plurality of condensing channels and the vapor supply path, and wherein the separation wall engages the evaporator section and the condenser section so that the evaporation channels and the liquid return path are on opposite sides of the separation wall, and the condensing channels and the vapor supply path are on opposite sides of the separation wall.

13. The device of claim 1, comprising an evaporator thermal transfer structure in direct thermal contact with portions of the evaporator section, and a condenser thermal transfer structure in direct thermal contact with portions of the condenser section.

14. The device of claim 13, wherein the evaporator section is formed as a single, integrated part including a plurality of evaporation channels and the liquid return path, and portions of the evaporator section adjacent the liquid return path is free of contact with the evaporator thermal transfer structure.

15. The device of claim 13, wherein the condenser section is formed as a single integrated part including a plurality of condensing channels and the vapor supply path portions of the condenser section adjacent the vapor supply path is free of contact with the condenser thermal transfer structure.

16. A thermosiphon cooling device including:
at least one evaporator section including at least one evaporation channel arranged to receive heat and evaporate a liquid in the at least one evaporation channel and a liquid return path for delivering condensed liquid to the at least one evaporation channel;
at least one condenser section including at least one condensing channel arranged to transfer heat from evaporated liquid to a surrounding environment to condense the evaporated liquid and a vapor supply path for delivering evaporated liquid to the at least one condensing channel; and
a single manifold having a vapor chamber fluidly connecting the at least one evaporation channel with the vapor supply path and a liquid chamber fluidly connecting the at least one condensing channel with the liquid return path, the vapor chamber and the liquid chamber being fluidly separated by a separation wall in the manifold to enable cyclical flow in the thermosiphon cooling device from the vapor chamber to the vapor supply path, the at least one condensing channel, the liquid chamber, the liquid return path, the at least one evaporation channel, and back to the vapor chamber,
wherein the thermosiphon device includes:
two or more evaporator sections, each evaporator section including a tube that is connected to the single manifold and includes multiple channels to define the at least one evaporation channel and a liquid return path; OR
two or more condenser sections, each condenser section including a tube that is connected to the single manifold and includes multiple channels to define the at least one condensing channel and the vapor supply path.

17. The device of claim 16, wherein the single manifold includes an outer wall that defines an interior cavity and the separation wall is positioned in the interior cavity to separate the interior cavity into the vapor chamber and the liquid chamber.

18. The device of claim 17, wherein the outer wall includes a plurality of openings each to receive a manifold end of a corresponding evaporator section or condenser section.

19. The device of claim 18, wherein each evaporator section is received at a corresponding one of the plurality of openings and engages the separation wall such that the at least one evaporation channel is in fluid communication with the vapor chamber and the liquid return path is in fluid communication with the liquid chamber.

20. The device of claim 19, wherein each condenser section is received at a corresponding one of the plurality of openings and engages the separation wall such that the at least one condensing channel is in fluid communication with the liquid chamber and the vapor supply path is in fluid communication with the vapor chamber.

21. The device of claim 20, wherein the device includes a plurality of evaporator sections and a plurality of condenser sections each received at a corresponding one of the plurality of openings and engaged with the separation wall.

22. The device of claim 21, wherein each evaporator section is formed as a single, integrated part including a plurality of evaporation channels and the liquid return path, and each condenser section is formed as a single integrated part including a plurality of condensing channels and the vapor supply path.

23. The device of claim 20, wherein the plurality of evaporation channels and the liquid return path are arranged in parallel with the liquid return path at one edge of each evaporator section, and wherein the plurality of condensing channels and the vapor supply path are arranged in parallel with the vapor supply path at one edge of each condenser section.

24. The device of claim 16, wherein the separation wall includes a plurality of vapor chamber openings that each receive a corresponding portion of a condenser section that includes the vapor supply path, and a plurality of liquid chamber openings that each receive a corresponding portion of an evaporator section that includes the liquid return path.

25. The device of claim 16, wherein each evaporator section is formed as a single, integrated part including a plurality of evaporation channels and the liquid return path, and each condenser section is formed as a single integrated part including a plurality of condensing channels and the vapor supply path, and wherein the separation wall engages each evaporator section and each condenser section so that the evaporation channels and the liquid return path are on opposite sides of the separation wall, and the condensing channels and the vapor supply path are on opposite sides of the separation wall.

26. The device of claim 17, wherein the outer wall and the separation wall are formed from a single bent sheet.

27. The device of claim 16, wherein each evaporator section is formed as a single, integrated part including a plurality of evaporation channels and the liquid return path, and each condenser section is formed as a single integrated part including a plurality of condensing channels and the vapor supply path.

28. The device of claim 27, comprising an evaporator thermal transfer structure in direct thermal contact with portions of each evaporator section, and a condenser thermal transfer structure in direct thermal contact with portions of each condenser section.

29. The device of claim 28, wherein portions of each evaporator section adjacent the liquid return path is free of contact with the evaporator thermal transfer structure.

30. The device of claim 28, wherein portions of each condenser section adjacent the vapor supply path is free of contact with the condenser thermal transfer structure.

31. A thermosiphon cooling device including:
an evaporator section including at least one evaporation channel arranged to receive heat and evaporate a liquid in the at least one evaporation channel and a liquid return path for delivering condensed liquid to the at least one evaporation channel;
a condenser section including at least one condensing channel arranged to transfer heat from evaporated liquid to a surrounding environment to condense the evaporated liquid and a vapor supply path for delivering evaporated liquid to the at least one condensing channel;
a manifold having a vapor chamber fluidly connecting the at least one evaporation channel with the vapor supply path and a liquid chamber fluidly connecting the at least one condensing channel with the liquid return path, the vapor chamber and the liquid chamber being fluidly separated by a separation wall in the manifold to enable cyclical flow in the thermosiphon cooling device from the vapor chamber to the vapor supply path, the at least one condensing channel, the liquid chamber, the liquid return path, the at least one evaporation channel, and back to the vapor chamber; and
a conductive thermal transfer structure arranged to conductively transmit heat with respect to the at least one evaporation channel or the at least one condensing channel, wherein the at least one evaporation channel and the liquid return path are integrated into a single unitary part with the conductive thermal transfer structure in conductive thermal contact only with a portion of the evaporator section adjacent the at least one evaporation channel and a portion of the evaporator section adjacent the liquid return path is free of any conductive thermal transfer structure, OR the at least one condensing channel and the vapor supply path are integrated into a single unitary part with the conductive thermal transfer structure in conductive thermal contact only with a portion of the condenser section adjacent the at least one condensing channel and a portion of the condenser section adjacent the vapor supply path is free of any conductive thermal transfer structure.

32. The device of claim 31, wherein the conductive thermal transfer structure includes a plurality of fins in conductive thermal contact with the portion of the evaporator section adjacent the at least one evaporation channel.

33. The device of claim 32, wherein the conductive thermal transfer structure includes a plurality of fins in conductive thermal contact with the portion of the condenser section adjacent the at least one condensing channel.

34. The device of claim 31, wherein the conductive thermal transfer structure includes a plurality of fins in conductive thermal contact with the portion of the condenser section adjacent the at least one condensing channel.

* * * * *